United States Patent [19]

Aoshima et al.

[11] Patent Number: 4,891,579

[45] Date of Patent: Jan. 2, 1990

[54] VOLTAGE DETECTOR

[75] Inventors: Shinichiro Aoshima; Yutaka Tsuchiya, both of Hamamatsu, Japan

[73] Assignee: Hamamatsu Photonics Kabushiki Kaisha, Shizuoka, Japan

[21] Appl. No.: 212,984

[22] Filed: Jun. 29, 1988

[30] Foreign Application Priority Data

Jun. 30, 1987 [JP] Japan .................. 62-163540

[51] Int. Cl.$^4$ ............................. G01R 29/12
[52] U.S. Cl. ....................... 324/96; 350/356
[58] Field of Search ................. 324/96; 356/365, 366, 356/367, 368, 435, 73.1; 332/7.51

[56] References Cited

U.S. PATENT DOCUMENTS

| | | | |
|---|---|---|---|
| 4,070,621 | 1/1978 | Bassen et al. | 324/96 |
| 4,446,425 | 5/1984 | Valdmanis et al. | 324/77 |
| 4,603,293 | 7/1986 | Mourou et al. | 324/96 |
| 4,618,819 | 10/1986 | Mourou et al. | 324/96 |
| 4,660,978 | 4/1987 | Ferrano | 351/1 |
| 4,681,447 | 7/1987 | Davidson | 356/351 |

FOREIGN PATENT DOCUMENTS 0197196 10/1986 European Pat. Off. .

OTHER PUBLICATIONS

Tsuchiya, Advances In Streak Camera Instrumentation for the Study of Biological and Physical Processes, 12/84, IEEE Journal of Quantum Electronics, vol. QE-20, No. 12.

Kolner et al., "Electrooptic Sampling in GaAs Integrated Circuits," IEEE Journal of Quantum Electronics, vol. QE-22, No. 1, pp. 79-93, Jan. 1986.

Valdmanis et al., "Picosecond Electro-Optic Sampling System," Appl. Phys. Lett. 41(3), pp. 211-212, Aug. 1, 1982.

Valdmanis et al., "Electro-Optic Sampling: Testing Picosecond Electronics Part 1, Principles and Embodiments," Laser Focus/Electro-Optics, pp. 84-96, Feb. 1986.

Valdmais et al., "Electro-Optic Sampling: Testing Picosecond Electronics Part 2, Applications," Laser Focus/Electro-Optics, pp. 96-106, Mar. 1986.

Valdmanis et al., "Subpicosecond Electrooptic Sampling: Principles and Applications," IEEE Journal of Quantum Electronics, vol. QE-22, No. 1, pp. 69-78, Jan. 1986.

Williamson et al., "Picosecond Electro-Electron Optic Oscilloscope," Proc. Cont. Picosecond Electron. Optoelectron, (N.Y. Springer-Verlag 1985) pp. 58-61.

Valdmanis et al., "Subpicosecond Electrical Sampling and Applications" Picosecond Optoelectronic Devices, Chapter 8, pp. 249-270, 1984.

Nees et al., "Noncontact Electro-Optic Sampling with a GaAs Injection Laser," Electronics Letters, vol. 22, No. 17, pp. 918-919, 8/14/86.

Kolner et al., "Electro-Optic Sampling with Picosecond Resolution," Electronic Letters, vol. 19, No. 15, pp. 574-575, Jul. 1983.

Valdmanis, "High-Speed Optical Electronics: the Picosecond Optical Oscilloscope," Solid State Technology/Test & Measurement World, Nov. 1986.

Valdmanis et al., "Subpicosecond Electrical Sampling," IEEE Journal of Quantum Electronics, vol. QE-19, No. 4, pp. 664-667, Apr. 1983.

Primary Examiner—Reinhard J. Eisenzopf
Assistant Examiner—Edward Urban
Attorney, Agent, or Firm—Finnegan, Henderson, Farabow, Garrett and Dunner

[57] ABSTRACT

A voltage detector detects and indicates simultaneously the voltage levels at a plurality of parts of an object to be measured. A probe formed of electrooptic material having a refractive index changed in the presence of a voltage placed near the object and beams of polarized light are transmitted through the probe and reflected by a polarized beam splitter to a detector for indicating the voltage levels at the parts of the object.

14 Claims, 5 Drawing Sheets

VOLTAGE DETECTOR

BACKGROUND OF THE INVENTION

1. (Field of the Invention)

The present invention relates to a voltage detector for detecting the voltage developing in a selected area of an object to be measured such as an electric circuit. In particular, the present invention relates to a voltage detector of the type that detects voltage by making use of the change in light polarization that occurs in accordance with the voltage developing in a selected area of an object to be measured.

2. (Prior Art)

Various voltage detectors have been used to detect the voltage developing in a selected area of objects to be measured such as electric circuits. Conventional voltage detectors are roughly divided into two types: in one type, the probe is brought into contact with a selected area of an object to be measured and the voltage developing in that area is detected; and in the other type, the probe does not make contact with a selected area of an object to be measured and instead an electron beam is launched into that area and the voltage developing in it is detected.

Voltage changes rapidly in fine-line portions of objects such as integrated circuits that are small and complicated in structure, and a strong demand exists in the art for detecting such rapidly changing voltage with high precision without affecting the condition of the fine-line portions However, this need has not been fully met by the prior art voltage detectors. With detectors of the type that detects voltage by bringing the probe into contact with a selected area of an object to be measured, it is difficult to attain direct contact between the probe and a fine-line portion of the object of interest such as an integrated circuit. Even if this is successfully done, it has been difficult to correctly analyze the operation of the integrated circuit solely on the basis of the voltage information picked up by the probe. A further problem involved is that contact by the probe can cause a change in the operation of the integrated circuit. Voltage detectors of the type that employs an electron beam has the advantage that they are capable of voltage detection without bringing the probe into contact with an object to be measured. However, the area to be measured with such voltage detectors has to be placed in vacuum and its surface must be exposed at that. In addition, the area to be measured is prone to be damaged by the electron beam.

The prior art voltage detectors have a common problem in that they are unable to operate quickly enough to follow rapid changes in voltage and hence fail to achieve precise detection of voltages that change rapidly as in integrated circuits.

With a view to solving these problems, it has been proposed by two of the present inventors (Japanese Patent Application No. 137317/1987 filed on May 30, 1987) that voltage be detected by making use of the polarization of a light beam that changes with the voltage developing in a selected area of an object to be measured.

Figure 7:
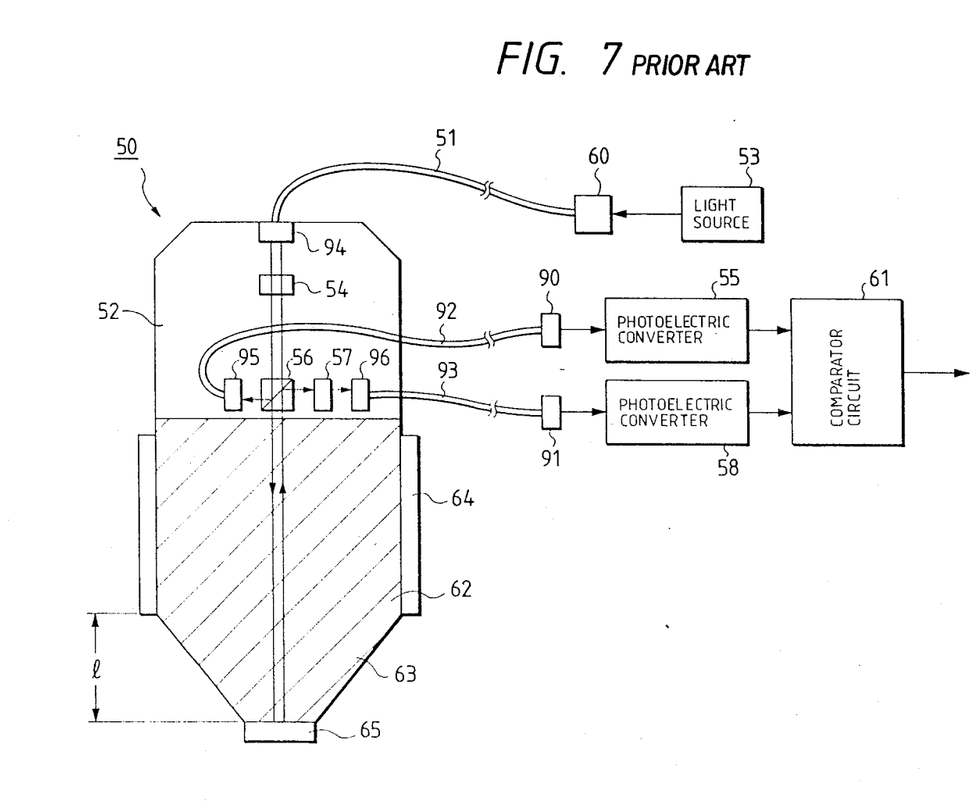
FIG. 7 is an explanatory diagram showing the arrangement of a conventional voltage detector.

A voltage detector operating on this principle is schematically shown in FIG. 7. The detector generally indicated by 50 is composed of the following components: an optical probe 52; a CW (Continuous-Wave) light source 53 typically in the form of a laser diode; an optical fiber 51 for guiding a light beam from the CW light source 53 into an optical probe 52 through a condenser lens 60; an optical fiber 92 for guiding reference light from the optical probe 52 into a photoelectric converter 55 through a collimator 90; an optical fiber 93 for guiding output light from the optical probe 52 into a photoelectric converter 58 through a collimator 91; and a comparator circuit 61 for comparing the electric signals form the photoelectric converters 55 and 58.

The optical probe 52 is equipped with an electro-optic material 62 such as an optically uniaxial crystal of lithium tantalate ($LiTaO_3$). The tip 63 of the electro-optic material 62 is worked into a frustoconical shape. The optical probe 52 is surrounded with a conductive electrode 64 and has at its tip 63 a coating of reflecting mirror 65 in the form of a thin metal film or a multilayered dielectric film.

The optical probe 52 further includes the following components: a collimator 94; condenser lenses 95 and 96; a polarizer 54 for selectively extracting a light beam having a predetermined polarized component from the light beam passing through the collimator 94; and a beam splitter 56 that splits the extracted light beam from the polarizer 54 into reference light and input light to be launched into the electro-optic material 62 and which allows the output light emerging from the electro-optic material 62 to be directed into an analyzer 57. The reference light is passed through the condenser lens 95 and thence launched into the optical fiber 92, whereas the output light emerging from the electro-optic material 62 is passed through the condenser lens 96 and thence launched into the optical fiber 93.

Voltage detection with the system shown in FIG. 7 starts with connecting the conductive electrode 64 on the circumference of the optical probe 52 to a predetermined potential, say, the ground potential. Then, the tip 63 of the probe 52 is brought close to the object to be measured such as an integrated circuit (not shown), whereupon a change occurs in the refractive index of the tip 63 of the electro-optic material 62 in the probe 52. Stated more specifically, the difference between refractive indices for an ordinary ray and an extraordinary ray in a plane perpendicular to the light-traveling direction will change in the optically uniaxial crystal.

The light beam issuing from the light source 53 passes through the condenser lens 60 and is guided through the optical fiber 51 to be directed into the collimator 94 in the optical probe 52. The light beam is polarized by the polarizer 54 and a predetermined polarized light having intensity I is launched into the electro-optic material 62 in the optical probe 52 through the beam splitter 56. Each of the reference light and the input light, which are produced by passage through the beam splitter 56, has an intensity of I/2. As already mentioned, the refractive index of the tip 63 of the electro-optic material 62 varies with the voltage on the object being measured, so the input light launched into the electro-optic material 62 will experience a change in the state of its polarization at the tip 63 in accordance with the change in the refractive index of the latter. The input light is then reflected from the reflecting mirror 65 and makes a return trip through the electro-optic material 62, from which it emerges and travels back to the beam splitter 56. If the length of the tip 63 of the electro-optic material 62 is written as l, the state of polarization of input light launched into that material will change in proportion to the difference between refractive indices for the ordinary ray and the extraordinary ray and to the length 21 as well. The output light sent back into the beam splitter 56 is thence directed into the analyzer 57. The intensity of the output light entering the analyzer 57 has been decreased to I/4 as a result of splitting with the beam splitter 56. If the analyzer 57 is designed in such a way as to transmit only a light beam having a polarized component perpendicular to that extracted by the polarizer 54, the intensity of output light that is fed into the analyzer 57 after experiencing a change in the state of its polarization is changed from I/4 to (I/4)$\sin^2[(\pi/2)V/V_0]$ in the analyzer 57 before it is further fed into the photoelectric converter 58. In the formula expressing the intensity of output light emerging from the analyzer 57, V is the voltage developing in the object to be measured, and $V_0$ is a half-wave voltage.

In the comparator circuit 61, the intensity of electric signal produced from the photoelectric converter 55, which is according to the reference light intensity I/2, is compared with the intensity of output electric signal produced from the other photoelectric converter 58, which is according to the output light intensity (I/4)$\sin^2[(\pi/2)V/V_0]$.

The intensity of output light, or (I/4)$\sin^2[(\pi/2)V/V_0]$, will vary with the change in the refractive index of the tip 63 of the electro-optic material 62 that occurs as a result of the change in voltage. Therefore, this intensity can be used as a basis for detecting the voltage developing in a selected area of the object to be measured, say, an integrated circuit.

As described above, in using the voltage detector 50 shown in FIG. 7, the tip 63 of the optical probe 52 is brought close to the object to be measured and the resulting change in the refractive index of the tip 63 of the electro-optic material 62 is used as a basis for detecting the voltage developing in a selected area of the object of interest. Therefore, the voltage developing in fine-line portions of a small and complicated object such as an integrated circuit which are difficult to be contacted by a probe or which cannot be contacted by the same without affecting the voltage being measured can be effectively detected by the detector 50 without bringing the optical probe 52 into contact with such fine-line portions.

The above-described voltage detector is disadvantageous in that it can detect a voltage provided at only one part of an object to be measured. In other words, it is impossible for the detector to simultaneously detect the voltages of a plurality of parts of the object, one-dimensionally or two-dimensionally.

SUMMARY OF THE INVENTION

An object of the present invention is to provide a voltage detector that can detect simultaneously the voltages of a plurality of parts of an object to be measured so that one-dimensionally or two-dimensionally voltage information is obtainable.

These and other objects are accomplished by a voltage detector for detecting and indicating simultaneously the voltage levels at a plurality of parts of an object to be measured comprising electro-optic materials to which parallel light beams having a predetermined polarization component are applied; and guide means for taking out of emergent light beams from the electro-optic materials only those having the predetermined polarization component and applying the emergent light beams thus taken to a photo-electric detector in a parallel mode while arranging the emergent light beams one-dimentionally or two-dimentionally.

BRIEF DESCRIPTION OF THE DRAWINGS

The manner by which the above objects, and other objects, features, and advantages of the present invention are attained will be fully apparent from the following detailed description when considered in view of the drawings, wherein.

DETAILED DESCRIPTION OF THE INVENTION

In the present invention, in order to detect the voltages of a plurality of parts of an object to be measured simultaneously, light beams having predetermined polarization components are applied, in the form of parallel light beams, to the portions of an electro-optic material. The refractive indexes of the electro-optic portions are changed by the differences between the potential of spacers isolating the electro-optic portions from one another and the voltages of the portions of the electro-optic material. The changes in the refractive indexes cause corresponding changes in the polarizations of the parallel light beams. The parallel light beams are reflected, as emergent light beams, from the electro-optic portions. Only the emergent light beams, having the predetermined polarization component are applied in parallel to a photoelectric detector, such as a streak camera, while being arranged one dimensionally or two-dimensionally. In the streak camera, the changes in intensity of the emergent light beams are converted into spatial images so that the voltages of the plurality of parts of the object can be detected simultaneously.

Figure 1:
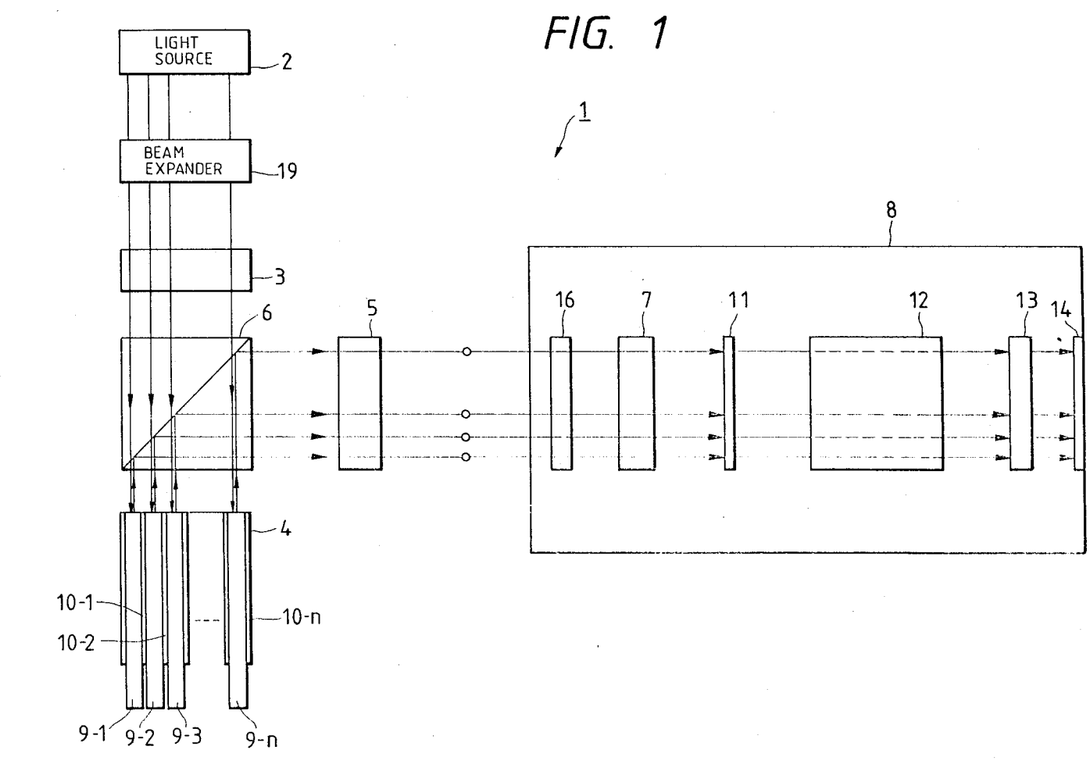
FIG. 1 is an explanatory diagram showing an arrangement of a first embodiment of a voltage detector according to the present invention.

FIG. 1 is an explanatory diagram showing the arrangement of a first example of a voltage detector according to the present invention. The voltage detector 1 is designed to detect simultaneously voltages of a one-dimensional part, namely a linear part, of an object to be measured. The voltage detector 1 comprises a light source 2 for outputting a light beam, a beam expander 19 for converting the output rays of the light source 2 into parallel rays, a cylindrical lens 3 for arranging the output parallel ray of the beam expander 19 in a line, and an optical probe 4 having electro-optic materials arranged one-dimensionally. A polarized beam splitter 6 allows the linearly arranged parallel rays outputted by the cylindrical lens 3 to advance, as incident rays, to the optical probe 4, and reflects emergent rays from the optical probe 4, which are arranged in a line, towards another cylindrical lens 5 and a streak camera 8 to which emergent rays from the cylindrical lens 5 are applied.

The electro-optic portions 9-1 through 9-n are arranged one-dimensionally in the optical probe 4 and are spaced from one another by spacers 10-1 through 10-n of conductive metal. The spacers 10-1 through 10-n are formed as one unit and, for instance, may be grounded in use. The end portions of the electro-optic portions 9-1 through 9-n are free from the spacers 10-1 through 10-n so that their refractive indexes change with the differences between the potential of the spacers 10-1 through 10-n and the voltages of the linear part of the object to be measured.

Figure 2:
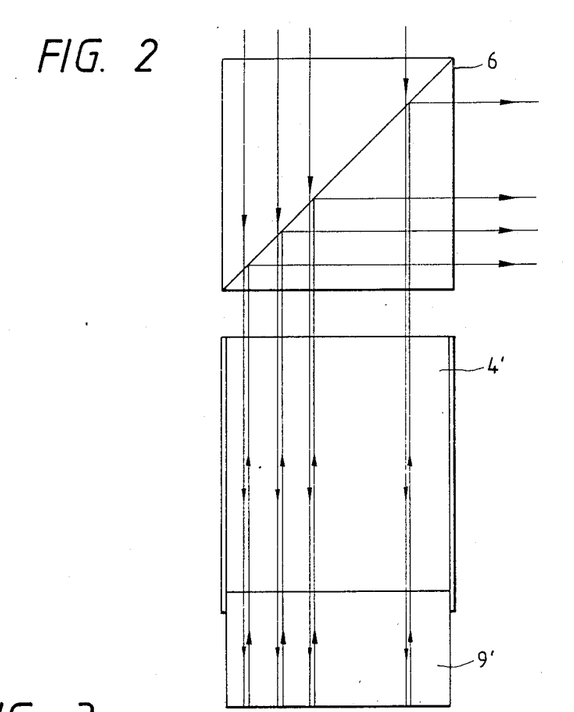
FIG. 2 is an explanatory diagram showing a modification of the optical probe in the detector shown in FIG. 1.

In the above-described detector, the electro-optic portions 9-1 through 9-n are isolated from one another by the spacers 10-1 through 10-n. The detector may be modified as shown in FIG. 2, such that only one portion of electro-optic material 9' is provided at one end of an optical probe 4'. It should be noted that in the voltage detector described below the electro-optic portions 9-1 through 9-n are isolated as shown in FIG. 1 for convenience in description.

Figure 4:
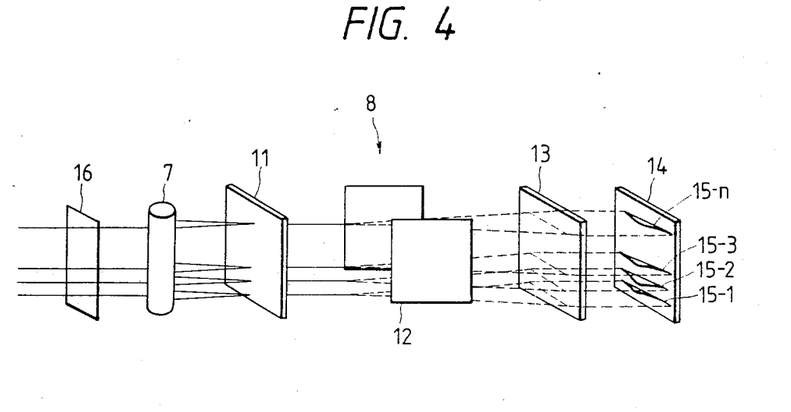
FIG. 4 is a perspective view of a streak camera.

The streak camera 8, as shown in FIGS. 1 and 4, comprises a slit 16 to which the emergent light beams from the cylindrical lens 5 are applied and a photocathode 11 to which the emergent light beams from the slit 16 are applied through a lens 7 in such a manner that they are arranged in a line so that corresponding electron beams arranged in a line may be provided. A pair of deflecting electrodes 12 horizontally deflect the linearly arranged electron beams outputted by the photocathode 11. A micro-channel plate 13 multiplies the deflected electron beams. A phosphor screen 14 is provided to receive the electron means from the micro-channel plate 13.

In the streak camera 8, a predetermined sawtooth voltage is applied to the deflecting electrodes 12 so that the intensities of the linearly arranged emergent light beams which are applied, in a time series mode, to the photocathode are converted into a spatial optical intensity distribution on the phosphor screen 14. In other words, spatial images 15-1 through 15-n are generated which extend along the horizontal axis.

In FIGS. 1 and 4, the micro-channel plate 13 and the phosphor screen 14 are shown separated from each other. It should be noted, however, that in practice those elements may be joined together. In addition, the lens 7 is shown as a cylindrical lens although in practice it need not be cylindrical.

Figure 3:
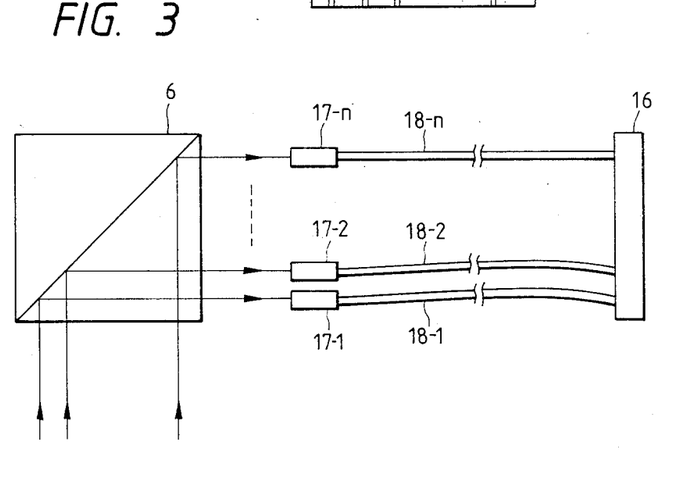
FIG. 3 is an explanatory diagram showing guide detectors for leading emergent light beams to a streak camera.

In the above-described detector, the emergent light beams from the cylindrical lens 5 are applied directly to the slit 16. The detector may be modified, as shown in FIG. 3, to provide a plurality of condenser lenses 17-1 through 17-n that are linearly arranged to receive emergent light beams from the polarized beams splitter 6.

The emergent light beams from the condenser lenses 17-1 through 17-n are applied to the slit 16 through optical fibers 18-1 through 18-n arranged in a line.

In the voltage detector thus organized, light beams emitted from the light source 2 are converted into parallel light beams by the beam expander 19. The parallel light beams are applied, as incident light beams arranged in a line, to the optical probe 4 through the cylindrical lens 3 and the polarized beams splitter 6. The incident light beams received by the optical probe 4 contain a predetermined polarization component, advance in the electro-optic portions 9-1 through 9-n, and reach the end portions of the electro-optic materials which are free from the spacers 10-1 through 10-n.

In the end portions, the refractive indexes are changed according to the voltages provided at the parts of the object to be measured which are just below the end portions. The polarizations of the incident light beams applied to the end portions of the electro-optic materials 9-1 through 9-n change with the refractive indexes of the end portions. Thereafter, the incident light beams, being reflected, return, as emergent light beams, to the polarized beam splitter 6 and only the emergent light beams having the proper polarization are applied, in a parallel mode, to the photocathode 11 of the streak camera 8 through the cylindrical lens 5, the slit 16, and the lens 7 in such a manner that they are arranged in a line. Alternatively, as was described above, the emergent light beams may be applied respectively through condenser lenses 17-1 through 17-n and corresponding optical fibers 18-1 through 18-n to the slit 16.

The linearly-arranged emergent light beams applied to the photocathode 11 are photoelectrically converted, to form electron beams arranged in a line. The electron beams are deflected horizontally by the deflecting electrodes 12 and applied through the micro-channel plate 13 to the phosphor screen 14, so that spatial images extending horizontally are formed on the phosphor screen 14. As is apparent from FIG. 4, the emergent light beams from the electro-optic materials 9-1, 9-2, 9-3, ... and 9-n of the optical probe 4 are converted into the spatial images 15-1, 15-2, 15-3, ... and 15-n, respectively, on the phosphor screen 14. The variations of voltages provided on the linear part of the object to be measured can be simultaneously detected as spatial images.

Figure 5:
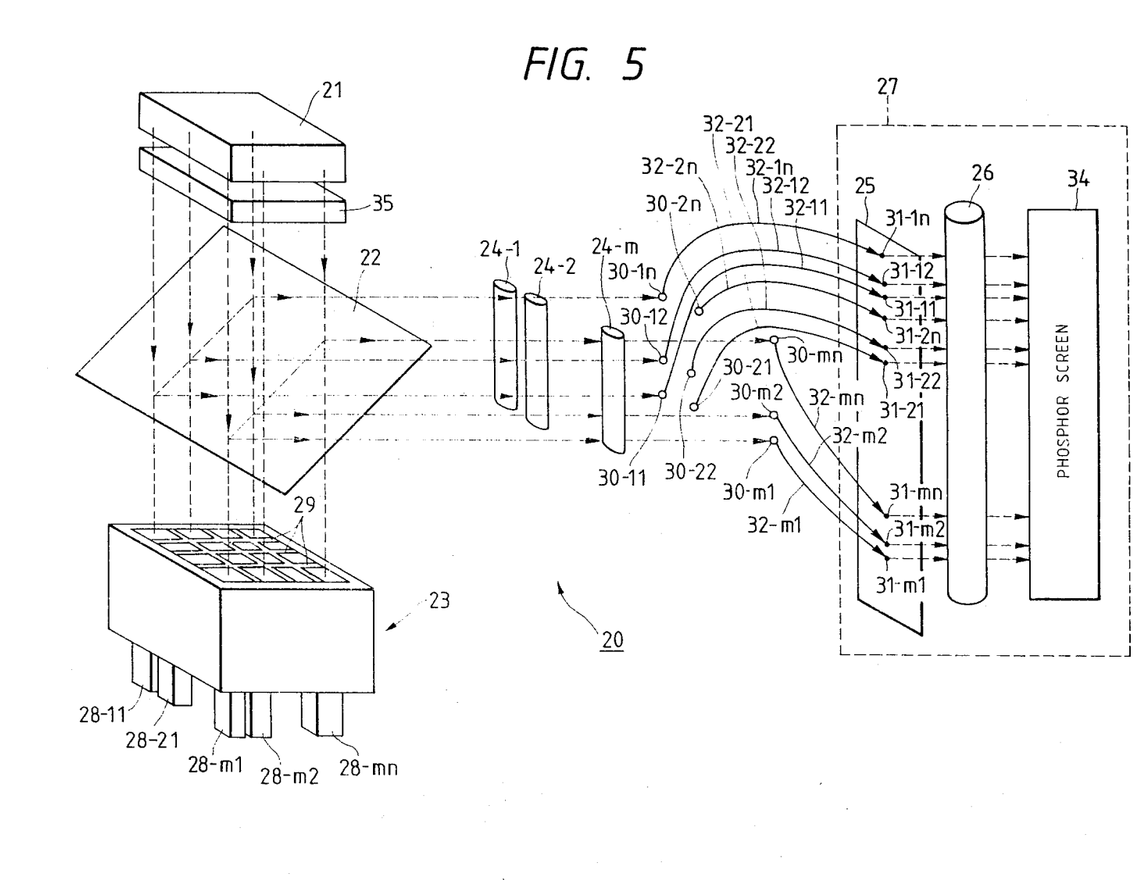
FIG. 5 is an explanatory diagram showing an arrangement of a second embodiment of the voltage detector according to the present invention.

FIG. 5 is an explanatory diagram showing an arrangement of a second example of the voltage detector according to the present invention. The voltage detector of FIG. 5 is designed to detect simultaneously voltages provided at a two-dimensional part of an object to be measured. The detector 20 includes a light source 21 for outputting two-dimensional light beams, a beam expander for converting the two-dimensional light beams into parallel light beams, and an optical probe in which electro-optic portions are arranged two-dimensionally. A polarized beam splitter 22 allows the two-dimensionally parallel light beam to pass, as incident light beams, to the optical probe 23 and reflects the emergent two-dimensional light beam from the optical probe 23 towards a plurality of condenser lenses 24-1 through 24-m. A streak camera 27 receives the emergent light beams from the condenser lenses 24-1 through 24-m.

The light source 21 is made up of a plurality of laser diodes arranged two-dimensionally for instance. In the optical probe 23, the electro-optic elements 28-11 through 28-mn are arranged two-dimensionally (in the form of an (m×n) matrix), and are isolated by conductive metal spacers 29 arranged as a lattice. The spacers 29 may be kept at ground potential. The end portions of the electro-optic elements 28-11 through 28-mn are free from the spacers 29, and their refractive indexes are changed by the differences between the potential of the spacers 29 and voltages provided at the corresponding two-dimensional parts of the object to be measured. As in the case of FIG. 2, instead of the plurality of electro-optic elements 28-11 through 28-mn, one electro-optic element may be employed.

The condenser lens 24-1 causes emergent light beams from the electro-optic elements 28-11 though 28-1n to be focused at nodes 30-11 through 30-1n, respectively, ... and the condenser lens 24-m causes emergent light beams from the electro-optic elements 28-m1 through 28-mn to be focused at nodes 30-m1 through 30-mn, respectively. The emergent light beams focused at the nodes 30-11 through 30-1n, 30-21 through 30-2n, ... and 30-m1 through 30-mn are transmitted to a slit 25 through optical fibers 32-11 through 32-1n, 32-21 through 32-2n, ... 31-21 through 31-2n, ... and 31-m1, respectively. The streak camera 27 is similar in arrangement to the streak camera 8 shown in FIG. 1.

Figure 6:
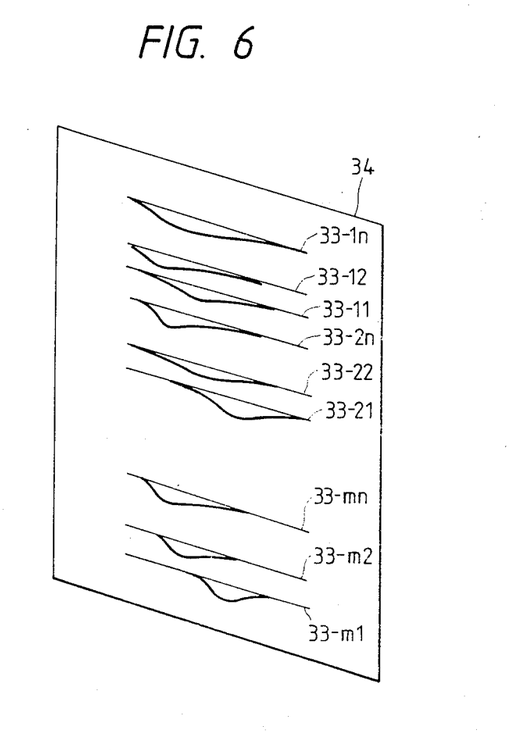
FIG. 6 is a diagram showing spatial images formed on the phosphor screen of the streak camera shown in FIG. 5.

As in the voltage detector of FIG. 1, in the voltage detector 20 of FIG. 5, the emergent light beams from the electro-optic elements 28-11 through 28-mn are applied, in the form of parallel lines, to the slit 25 of the streak camera 27, and are reproduced as spatial images 33-11 through 33-mn on the phosphor screen 34 of the streak camera 27 as shown in FIG. 6. Thus, the variations of the voltages at the two-dimensional parts of the object can be simultaneously detected as spatial images on the phosphor screen 34.

In the voltage detectors shown in FIGS. 1 and 5, only the electro-optic elements and the spacers are provided in the optical probes 4 and 23; however, the cylindrical lenses 3 and 5 and the polarized beam splitter 6 may be included in the optical probe 4, and the condenser lenses 24-1 through 24-m and the polarized beam splitter 22 may be included in the optical probe 23.

The above-described examples of the voltage detector employ a streak camera; however, the invention is not limited thereto or thereby. For instance, the optical fibers 18-1 through 18-n may be coupled to high-speed response detectors such as avalanche photodiodes or PIN photodiodes. Furthermore, in the above-described detectors, the CW light beams and the high-speed response detector are used in combination. The detectors may also be modified so that short pulsed light beams and a CCD camera or a plurality of photodiodes are used in combination and voltages at a predetermined part of an object to be measured are detected by sampling.

In the above-described embodiments, it is preferable to paint the inner walls of the optical probes 4 and 23 black to prevent the scattering of light therein.

As was described above, in the voltage detector of the present invention, parallel light beams having a predetermined polarization component are applied to the electro-optic materials, and only the emergent light beams having a predetermined polarization component are applied, in a parallel mode, to the photoelectric detector while being arranged one-dimensionally or two-dimensionally. Therefore, with the photoelectric detector, the voltages of a plurality of parts of an object to be measured can be detected simultaneously. In other words, one-dimensional or two-dimensional voltage data relating to areas of the object can be obtained with ease.

What is claimed is:

1. A voltage detector for detecting the voltage at the parts of an object to be measured, comprising:
    an electro-optic material having a plurality of portions whose refractive indexes are changed according to the voltages at a corresponding plurality of parts of said object, respectively;
    means for applying parallel light beams having a first predetermined polarization component to said electro-optic material, the polarizations of said parallel light beams applied to said electro-optic material being changed according to said refractive indexes of said plurality of portions; and
    guide means for extracting emergent light beams having a second predetermined polarization component from a plurality of emergent light beams which emerge from said electro-optic material, and applying said emergent light beams having said second predetermined polarization component to a photo-electric detector in parallel, one-dimensionally.

2. A voltage detector as claimed in claim 1, wherein said light beams are CW light beams, and said photoelectric detector is a high-speed response detector.

3. A voltage detector as claimed in claim 2, wherein said high-speed response detector is a streak camera.

4. A voltage detector as claimed in claim 2, wherein said high-speed response detector comprises a plurality of avalanche photo-diodes.

5. A voltage detector as claimed in claim 2, wherein said high-speed response detector comprises a plurality of PIN photo-diodes.

6. A voltage detector as claimed in claim 1, wherein said light beams are pulsed light beams, and said photoelectric detector comprises a CCD camera to accomplish voltage detection by sampling.

7. A voltage detector as claimed in claim 1, wherein said light beams are pulsed light beams, and said photoelectric detector comprises a plurality of photo-diodes to accomplish voltage detection by sampling.

8. A voltage detector for detector for detecting the voltage at the parts of an object to be measured, comprising:
    an electro-optic material having a plurality of portions whose refractive indexes are changed according to the voltages at a corresponding plurality of parts of said object, respectively;
    means for applying parallel light beams having a first predetermined polarization component to said electro-optic material, the polarizations of said parallel light beams applied to said electro-optic material being changed according to said refractive indexes of said plurality of portions; and
    guide means for extracting emergent light beams having a second predetermined polarization component from a plurality of emergent light beams which emerge from said electro-optic material, and applying said emergent light beams having said second predetermined polarization component to a photo-electric detector in parallel, two-dimensionally.

9. A voltage detector as claimed in claim 8, wherein said light beams are CW light beams, and said photo-electric detector is a high-speed response detector.

10. A voltage detector as claimed in claim 9, wherein said high-speed response detector is a streak camera.

11. A voltage detector as claimed in claim 9, wherein said high-speed response detector comprises a plurality of avalanche photo-diodes.

12. A voltage detector as claimed in claim 9, wherein said high-speed response detector comprises a plurality of PIN photodiodes.

13. A voltage detector as claimed in claim 8, wherein said light beams are pulsed light beams, and said photo-electric detector comprises a CCD camera to accomplish voltage detection by sampling.

14. A voltage detector as claimed in claim 8, wherein said light beams are pulsed light beams, and said photo-electric detector comprises a plurality of photo-diodes to accomplish voltage detection by sampling.

* * * * *

UNITED STATES PATENT AND TRADEMARK OFFICE
CERTIFICATE OF CORRECTION

PATENT NO. : 4,891,579
DATED : January 02, 1990
INVENTOR(S) : Shinichiro Aoshima et al.

It is certified that error appears in the above-identified patent and that said Letters Patent is hereby corrected as shown below:

Claim 8, Column, 8, Line 29, change "for detector for detecting" to --for detecting--.

Signed and Sealed this

Ninth Day of April, 1991

Attest:

HARRY F. MANBECK, JR.

*Attesting Officer*  *Commissioner of Patents and Trademarks*